United States Patent
Liu et al.

(10) Patent No.: US 12,520,511 B2
(45) Date of Patent: Jan. 6, 2026

(54) HIGH ELECTRON MOBILITY TRANSISTOR STRUCTURE INCLUDING PASSIVATION CAPPING LAYER AND METHOD OF MANUFACTURING THE SAME

(71) Applicant: GLOBALWAFERS CO., LTD., Hsinchu (TW)

(72) Inventors: Jia-Zhe Liu, Hsinchu (TW); Tzu-Yao Lin, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 493 days.

(21) Appl. No.: 18/129,928

(22) Filed: Apr. 3, 2023

(65) Prior Publication Data
US 2023/0369447 A1 Nov. 16, 2023

(30) Foreign Application Priority Data
May 12, 2022 (TW) .................. 111117893

(51) Int. Cl.
*H10D 30/01* (2025.01)
*H01L 21/02* (2006.01)
(Continued)

(52) U.S. Cl.
CPC ....... *H10D 30/015* (2025.01); *H01L 21/0217* (2013.01); *H01L 21/02271* (2013.01); *H01L 21/02458* (2013.01); *H01L 21/0254* (2013.01); *H01L 21/0262* (2013.01); *H01L 22/14* (2013.01); *H01L 23/291* (2013.01);
(Continued)

(58) Field of Classification Search
CPC .... H10D 30/015; H10D 30/475; H10D 30/47; H10D 62/8503; H01L 21/0217; H01L 21/02271; H01L 21/02458; H01L 21/0254; H01L 21/0262; H01L 22/14; H01L 23/291; H01L 23/3171; H01L 21/02293
See application file for complete search history.

(56) References Cited

U.S. PATENT DOCUMENTS 9,359,693 B2 6/2016 Francis et al.
2011/0136305 A1 6/2011 Saxler et al.
2021/0104395 A1 4/2021 Yamamura et al.

FOREIGN PATENT DOCUMENTS

CN 114250510 A * 3/2022 ......... H01L 21/0262

OTHER PUBLICATIONS

Taiwanese Search Report for Taiwanese Application No. 111117893, dated Feb. 20, 2023, with an English translation.

* cited by examiner

*Primary Examiner* — John P. Dulka
(74) *Attorney, Agent, or Firm* — Birch, Stewart, Kolasch & Birch, LLP

(57) ABSTRACT

A method of manufacturing a high electron mobility transistor (HEMT) structure is disclosed. By controlling a passivation layer and a barrier layer to uninterruptedly grow in the same growth chamber, defects of the passivation layer generated in the growth process due to a drastic change in temperature, pressure, or atmosphere or degrading a quality of an interface between the passivation layer and the barrier layer could be avoided, thereby providing the passivation layer with a good quality and the interface between the passivation layer and the barrier layer with a good quality, so that the objective of improving the performance of the HEMT structure could be achieved.

20 Claims, 7 Drawing Sheets

(51) Int. Cl.
  *H01L 21/66*     (2006.01)
  *H01L 23/29*     (2006.01)
  *H01L 23/31*     (2006.01)
  *H10D 30/47*     (2025.01)
  *H10D 62/85*     (2025.01)
(52) U.S. Cl.
  CPC ....... *H01L 23/3171* (2013.01); *H10D 30/475* (2025.01); *H10D 62/8503* (2025.01)

HIGH ELECTRON MOBILITY TRANSISTOR STRUCTURE INCLUDING PASSIVATION CAPPING LAYER AND METHOD OF MANUFACTURING THE SAME

BACKGROUND OF THE INVENTION

Technical Field

The present invention relates generally to a semiconductor technology, and more particularly to a high electron mobility transistor.

Description of Related Art

A High Electron Mobility Transistor (HEMT) is typically a transistor having a two-dimensional electron gas (2-DEG) that is located close to a heterojunction of two materials with different energy gaps. As the HEMT makes use of the 2-DEG having a high electron mobility as a carrier channel of the transistor instead of a doped region, the HEMT has features of a high breakdown voltage, a high electron mobility, a low on-resistance, and a low input capacitance, thereby could be widely applied to high power semiconductor devices.

In order to improve the performance of the HEMT, a passivation layer, gallium nitride for example, is generally formed on a barrier layer of the HEMT, but an increase of surface defects is caused as gallium is easily bonded with oxygen, thereby causing a problem of an insufficient stability of a component and an increase of a leakage current. Therefore, how to provide a passivation layer, which could improve the performance of the HEMT, is a problem needed to be solved in the industry.

BRIEF SUMMARY OF THE INVENTION

In view of the above, the primary objective of the present invention is to provide a high electron mobility transistor (HEMT) structure and a method of manufacturing the same, which could provide a passivation layer with a good quality and thereby could improve the performance of the HEMT.

The present invention provides a method of manufacturing a high electron mobility transistor (HEMT) structure, including steps of:

A: provide a substrate;
B: form a nucleation layer on the substrate;
C: form a buffer layer on the nucleation layer;
D: form a channel layer on the buffer layer;
E: deposit a barrier layer on the channel layer, wherein a growth temperature of the barrier layer is a first growth temperature; a two-dimensional electron gas (2-DEG) region is formed in the channel layer along an interface between the channel layer and the barrier layer; step E is performed in a growth chamber; and
F: uninterruptedly deposit a passivation layer on the barrier layer in the growth chamber after performing step E, wherein a growth temperature of the passivation layer is controlled to increase from the first growth temperature to a second growth temperature through a heating session.

The present invention further provides a high electron mobility transistor (HEMT) structure including in order: a substrate, a nucleation layer, a buffer layer, a channel layer, a barrier layer, and a passivation layer; wherein a two-dimensional electron gas (2-DEG) region is formed in the channel layer along an interface between the channel layer and the barrier layer; a change of a sheet resistance value of the 2-DEG region of the channel layer in a period of time is less than or equal to 1%; the period of time is greater than or equal to three months.

With the aforementioned design, by controlling the passivation layer and the barrier layer to uninterruptedly grow in the same growth chamber, defects of the passivation layer generated in the growth process due to the drastic change in temperature, pressure, or atmosphere or degrading the quality of the interface between the passivation layer and the barrier layer could be avoided, thereby providing the passivation layer with a good quality and the interface between the passivation layer and the barrier layer with a good quality, so that the objective of improving the performance of the HEMT could be achieved. Additionally, the HEMT structure of the present invention could further achieve the objective of improving the stability thereof by forming the passivation layer, wherein the change of the sheet resistance value of the 2-DEG region of the channel layer in the period of time is less than or equal to 1%, and the period of time is greater than or equal to three months.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
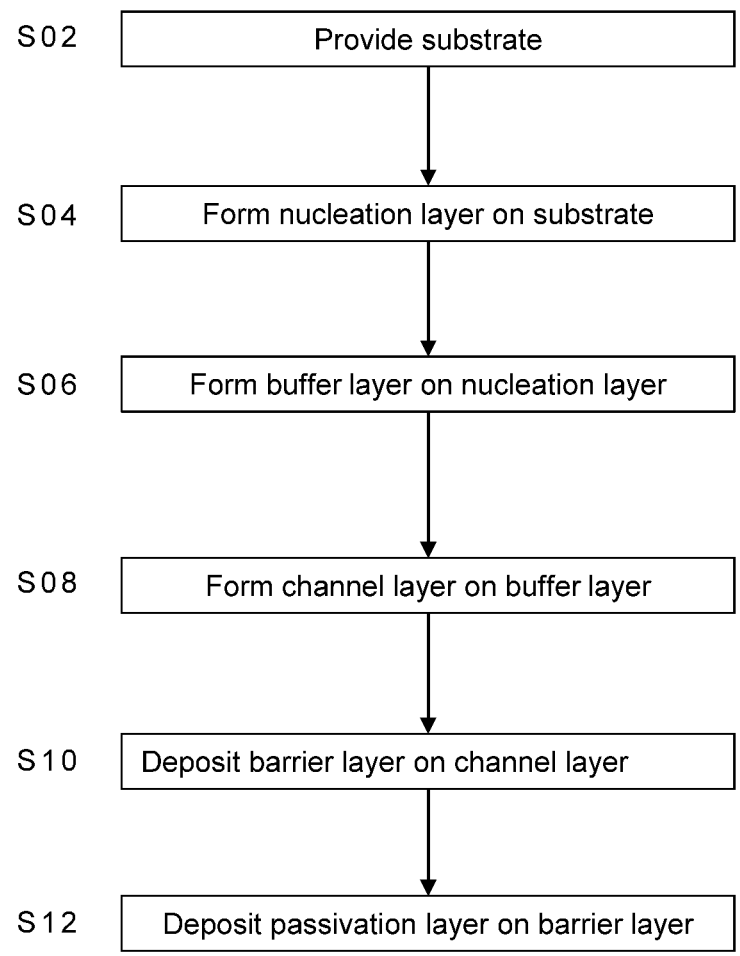
FIG. 1 is a flowchart of the method of manufacturing the HEMT structure according to an embodiment of the present invention.

A method of manufacturing a High Electron Mobility Transistor (HEMT) structure according to an embodiment of the present invention is illustrated in FIG. 1 and includes steps of:

step S02: provide a substrate 10; the substrate 10 could be a substrate made of, for example, silicon (Si), gallium arsenide (GaAs), gallium nitride (GaN), silicon carbide (SiC), or aluminum oxide ($Al_2O_3$);

step S04: form a nucleation layer 20 on the substrate 10; the nucleation layer 20 could be a nitride nucleation layer made of, for example, aluminum nitride (AlN) or aluminum gallium nitride (AlGaN), and could be formed by, for example, metal-organic chemical vapor deposition (MOCVD);

step S06: form a buffer layer 30 on the nucleation layer 20; the buffer layer 30 could be a nitride buffer layer made of, for example, gallium nitride (GaN), and could be formed by, for example, metal-organic chemical vapor deposition (MOCVD);

step S08: form a channel layer 40 on the buffer layer 30; the channel layer 40 could be a nitride channel layer made of, for example, gallium nitride (GaN), and could be formed by, for example, metal-organic chemical vapor deposition (MOCVD);

step S10: deposit a barrier layer 50 on the channel layer 40, wherein a growth temperature of the barrier layer 50 is defined as a first growth temperature T1; preferably, the first growth temperature T1 is between 700° C. and 1000° C.; a two-dimensional electron gas (2-DEG) region is formed in the channel layer 40 along an interface between the channel layer 40 and the barrier layer 50; step S10 is performed in a growth chamber; the barrier layer 50 could be a nitride barrier layer made of, for example, aluminum gallium nitride (AlGaN), aluminum nitride (AlN), indium aluminum nitride (AlInN), or indium gallium aluminum nitride (AlInGaN), and could be formed by, for example, metal-organic chemical vapor deposition (MOCVD) or molecular beam epitaxy (MBE); and step S12: uninterruptedly deposit a passivation layer 60 on the barrier layer 50 in the growth chamber after performing step S10; wherein a growth temperature of the passivation layer 60 is controlled to increase from the first growth temperature T1 to a second growth temperature T2 through a heating session RT; in the current embodiment, the second growth temperature T2 is greater than or equal to 1000° C.; the passivation layer 60 includes silicon nitride and could be formed by metal-organic chemical vapor deposition (MOCVD) or molecular beam epitaxy (MBE); a total thickness of the passivation layer 60 is less than or equal to 100 nm and is a distance from an interface between the passivation layer 60 and the barrier layer 50 to a top surface of the passivation layer 60.

In other words, after forming the barrier layer 50 in the growth chamber of a metal-organic chemical vapor deposition (MOCVD) device or the growth chamber of a molecular beam epitaxy (MBE) device, a semi-finished product obtained after step S10 is not removed from the growth chamber, i.e., the barrier layer 50 is not exposed to an atmosphere or an environment outside the growth chamber, and step S12 is directly performed in the growth chamber in a continuous way for forming the passivation layer 60. In other words, both the barrier layer 50 and the passivation layer 60 are formed in an identical growth condition of space, pressure, and atmosphere, and an initial growth temperature of the passivation layer 60 is the same as the growth temperature of the barrier layer 50, wherein the same atmosphere is to use an identical carrier gas, for example, hydrogen or nitrogen.

Therefore, by controlling the passivation layer 60 and the barrier layer 50 to uninterruptedly grow in the same growth chamber, defects of the passivation layer 60 generated in the growth process due to a drastic change in temperature, pressure, or atmosphere and degrading a quality of an interface between the passivation layer 60 and the barrier layer 50 could be avoided, thereby providing the passivation layer 60 with a good quality and the interface between the passivation layer 60 and the barrier layer 50 with a good quality, so that the objective of improving the performance of the HEMT could be achieved.

Step S12 includes controlling the growth temperature of the passivation layer 60 to maintain at the second growth temperature T2 in a constant high temperature session HT. In other words, referring to FIG. 3, the first growth temperature T1 is maintained in a first predetermined time t1 for growing the barrier layer 50, and then the passivation layer 60 is started to be grown, wherein the initial growth temperature of the passivation layer 60 is the same as the growth temperature of the barrier layer 50 and is increased to the second growth temperature T2 through the heating session RT, and then is maintained at the second growth temperature T2 in a second predetermined time t2 for growing the passivation layer 60 with a required thickness; a growth thickness of the passivation layer 60 in the constant high temperature session HT is greater than or equal to 50% of the total thickness of the passivation layer 60.

Figure 4:
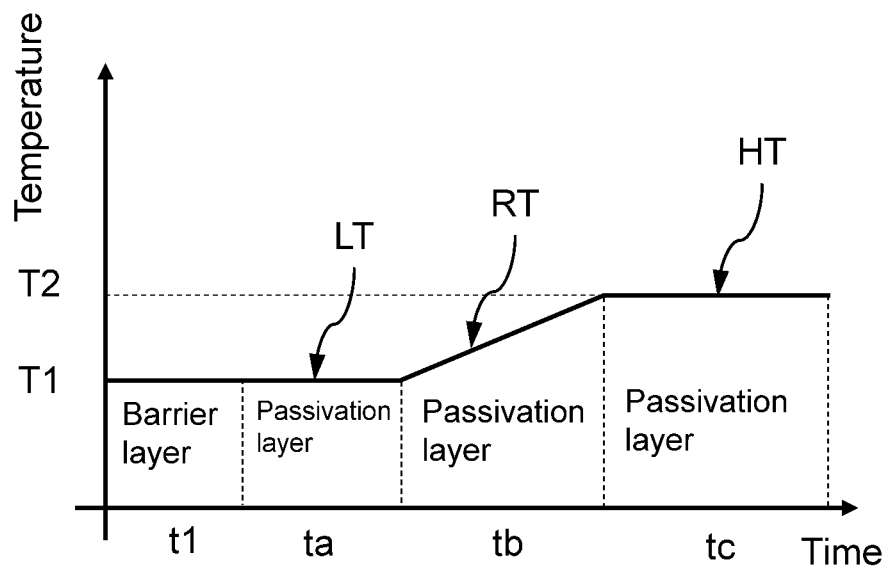
FIG. 4 is a schematic view showing a relationship between the time and the temperature of growing the passivation layer according to another embodiment of the present invention.

Referring to FIG. 4, in another embodiment, step S12 includes controlling the growth temperature of the passivation layer 60 to maintain at the first growth temperature T1 in a constant low temperature session LT, and then to maintain at the second growth temperature T2 in the constant high temperature session HT after heating in the heating session RT, wherein the total thickness of the passivation layer 60 is a sum of a growth thickness of the passivation layer 60 in the constant low temperature session LT, a growth thickness of the passivation layer 60 in the heating session RT, and the growth thickness of the passivation layer 60 in the constant high temperature session HT; the growth thickness of the passivation layer 60 in the constant low temperature session LT is between 0% and 25% of the total thickness of the passivation layer 60, and the growth thickness of the passivation layer 60 in the heating session RT is between 0% and 25% of the total thickness of the passivation layer 60.

In still another embodiment, the growth thickness of the passivation layer 60 in the constant low temperature session LT is 0% of the total thickness of the passivation layer 60, the growth thickness of the passivation layer 60 in the heating session RT is between 5% and 25% of the total thickness of the passivation layer 60, and the growth thickness of the passivation layer 60 in the constant high temperature session HT is between 75% and 95% of the total thickness of the passivation layer 60. In practice, a sum of the growth thickness of the passivation layer 60 in the heating session RT and the growth thickness of the passivation layer 60 in the constant high temperature session HT is less than or equal to 100% of the total thickness of the passivation layer 60. In other words, referring to FIG. 3, the growth temperature of the passivation layer 60 is controlled to increase from the first growth temperature T1 to the second growth temperature T2 in the heating session RT, and then to maintain at the second growth temperature T2 in the second predetermined time t2 for growing the passivation layer 60 with the required thickness.

In still another embodiment, the growth thickness of the passivation layer 60 in the constant low temperature session LT is between 0% and 25% of the total thickness of the passivation layer 60, the growth thickness of the passivation layer 60 in the heating session RT is between 5% and 25% of the total thickness of the passivation layer 60, and the growth thickness of the passivation layer 60 in the constant high temperature session HT is between 50% and 95% of the total thickness of the passivation layer 60. In practice, a sum of the growth thickness of the passivation layer 60 in the constant low temperature session LT, the growth thickness of the passivation layer 60 in the heating session RT, and the growth thickness of the passivation layer 60 in the constant high temperature session HT is less than or equal to 100% of the total thickness of the passivation layer 60.

Figure 5:
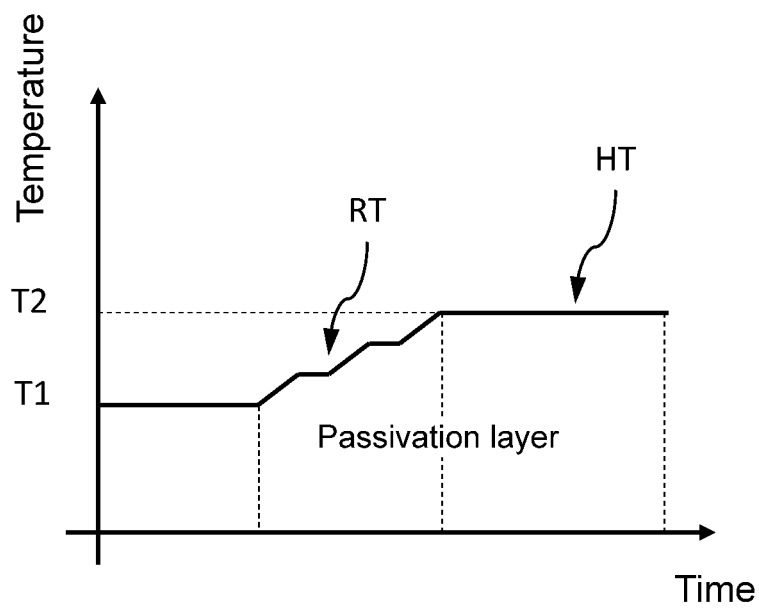
FIG. 5 is a schematic view showing a relationship between the time and the temperature of growing the passivation layer according to still another embodiment of the present invention.

Preferably, a heating rate of the heating session RT is between 10° C./min and 30° C./min. Referring to FIG. 5, in an embodiment, the heating session RT could include at least one heating step, wherein the number of the at least one heating step preferably is between 1 and 15, and by controlling an increase in temperature to be between 30° C. and 60° C. in each of the at least one heating step and controlling the heating rate in each of the at least one heating step to be less than or equal to 60° C./min, the passivation layer 60 with a better quality could be obtained.

A high electron mobility transistor (HEMT) structure 1 manufactured through the aforementioned method of manufacturing the HEMT structure has a better thin film density, a better surface roughness performance, and a better ability of withstanding voltage, wherein a refractive index of the passivation layer 60 satisfies between 2.05 and 2.28, a root-mean-square (RMS) roughness of the passivation layer 60 is less than or equal to 0.5 nm, and a breakdown voltage withstanding per unit thickness of the passivation layer 60 is between 1 V/nm and 1.15 V/nm; the refractive index is obtained by measuring with an ellipsometer.

Additionally, the method of manufacturing the HEMT structure includes measuring a sheet resistance value of the 2-DEG region of the channel layer 40 to obtain a first sheet resistance value and measuring the sheet resistance value of the 2-DEG region of the channel layer 40 after a period of time to obtain a second sheet resistance value, wherein the period of time is greater than or equal to three months. A percentage change of the sheet resistance value is defined as (the second sheet resistance value–the first sheet resistance value)/the first sheet resistance value*100%. An absolute value of a percentage change of the sheet resistance value of the HEMT structure 1 manufactured through the aforementioned method is less than or equal to 0.1%. In other words, the HEMT structure 1 manufactured through the aforementioned method has a good sheet resistance value stability.

Referring to Table 1, five comparative examples A to E and two embodiments A and B are illustrated in the below description. A second sheet resistance value of each of the comparative examples A to E and a second sheet resistance value of each of the embodiments A and B are measured to obtain four months after measuring a corresponding first sheet resistance value. The percentage change of the sheet resistance value is defined as above and is not repeated here.

The Comparative Examples A and B

In the comparative examples A and B, a passivation layer 60 is not deposited on a barrier layer 50. The difference between the comparative example A and the comparative example B is that the RCA clean process is performed on a structure of the comparative example A after the first sheet resistance value of the comparative example A is measured, while the RCA clean process is not performed on a structure of the comparative example B after the first sheet resistance value of the comparative example B is measured. Referring to Table 1, a sheet resistance value of the structure of the comparative example A after the RCA clean process is greatly increased from 372.7 ohm/sq to 687 ohm/sq, while a percentage change of a sheet resistance value of the structure of the comparative example B is still as high as 3.57% even through the RCA clean process is not performed.

The Comparative Examples C to E

In the comparative examples C to E, a passivation layer 60 is deposited on a barrier layer 50 in an interrupted way, wherein the interrupted way indicates that after depositing the barrier layer 50 in a growth chamber, the passivation layer 60 is not uninterruptedly grown in the same growth chamber with the same temperature, the same pressure, and the same atmosphere that the barrier layer 50 is deposited. The difference among the comparative example C to the comparative example E is that the RCA clean process is respectively performed on a structure of the comparative example C and a structure of the comparative example D after the corresponding first sheet resistance value is measured, while the RCA clean process is not performed on a structure of the comparative example E after the first sheet resistance value of the structure of the comparative example E is measured.

Referring to Table 1, a sheet resistance value of the structure of the comparative example C and a sheet resistance value of the structure of the comparative example D measured after the RCA clean process do not greatly change and have some improvements compared with the sheet resistance value of the comparative example A, wherein the sheet resistance value of the comparative example A after the RCA clean process is 1.8 times greater than the first sheet resistance value of the comparative example A before the RCA clean process. In other words, by depositing the passivation layer 60 on the barrier layer 50, a sheet resistance value stability could be slightly improved. A percentage change of a sheet resistance value of the comparative example E still reaches –0.87% even through the RCA clean process is not performed.

The Embodiments A and B

In the embodiments A and B, a passivation layer 60 is uninterruptedly deposited on a barrier layer 50 through the aforementioned method of manufacturing the HEMT structure. The difference between the embodiment A and the embodiment B is that the RCA clean process is performed on a structure of the embodiment A after the first sheet resistance value of the embodiment A is measured, while the RCA clean process is not performed on a structure of the embodiment B after the first sheet resistance value of the embodiment B is measured. Referring to Table 1, a sheet resistance value of the structure of the embodiment A after the RCA clean process does not greatly change, and a percentage change of the sheet resistance value of the structure of both the embodiment A and the embodiment B is –0.05%. In other words, the HEMT structure 1 manufactured through the aforementioned method of manufacturing the HEMT structure has a good sheet resistance value stability, and the absolute value of the percentage change of the sheet resistance value could be controlled to be less than 0.1%.

TABLE 1

| | Growth condition | RCA clean process | First sheet resistance value (ohm/sq) | Sheet resistance value after RCA clean process (ohm/sq) | Second sheet resistance value (ohm/sq) | Percentage change of the sheet resistance value (%) |
|---|---|---|---|---|---|---|
| The comparative example A | The passivation layer is not deposited | Yes | 372.7 | 687 | 685 | 83.79 |
| The comparative example B | The passivation layer is not deposited | No | 369.7 | — | 382.9 | 3.57 |
| The comparative example C | The passivation layer with 40 nm is deposited in an interrupted way | Yes | 588.6 | 591.7 | 589.3 | 0.12 |
| The comparative example D | The passivation layer with 40 nm is deposited in an interrupted way | Yes | 537.9 | 537.6 | 538.8 | 0.17 |
| The comparative example E | The passivation layer with 40 nm is deposited in an interrupted way | No | 564.9 | — | 560 | −0.87 |
| The embodiment A | The passivation layer with 40 nm is uninterruptedly deposited | Yes | 386.1 | 385.5 | 385.9 | −0.05 |
| The embodiment B | The passivation layer with 40 nm is uninterruptedly deposited | No | 381.2 | — | 381 | −0.05 |

A comparative example 1 and four embodiments 1 to 4 are illustrated in the below description. In the comparative example 1 and the embodiments 1 to 4, after depositing a barrier layer 50, a passivation layer 60 is uninterruptedly grown in a growth chamber that the deposition of the barrier layer 50 takes place in with the same temperature, the same pressure, and the same atmosphere, wherein a first growth temperature T1 is 900° C., and a second growth temperature T2 is 1000° C.; a total thickness of the passivation layer 60 is the same as the aforementioned description, i.e., the sum of the growth thickness of the passivation layer 60 in the constant low temperature session LT, the growth thickness of the passivation layer 60 in the heating session RT, and the growth thickness of the passivation layer 60 in the constant high temperature session HT; the total thickness of the passivation layer 60 in the comparative example 1 is the same as the total thickness of the passivation layer 60 in each of the embodiments 1 to 4; a thickness percentage of the passivation layer 60 in the constant high temperature session HT is a percentage of the growth thickness of the passivation layer 60 in the constant high temperature session HT over the total thickness of the passivation layer 60, a thickness percentage of the passivation layer 60 in the heating session RT is a percentage of the growth thickness of the passivation layer 60 in the heating session RT over the total thickness of the passivation layer 60, and a thickness percentage of the passivation layer 60 in the constant low temperature session LT is a percentage of the growth thickness of the passivation layer 60 in the constant low temperature session LT over the total thickness of the passivation layer 60.

The Comparative Example 1

Figure 6:
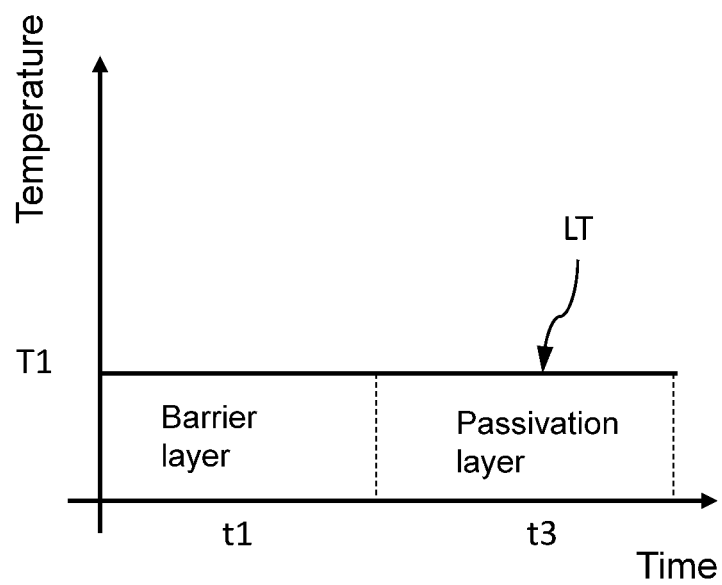
FIG. 6 is a schematic view showing a relationship between the time and the temperature of growing the passivation layer according to a comparative example 1 of the present invention.

Referring to FIG. 6, in the comparative example 1, the growth temperature of the passivation layer 60 is controlled to be the same as the first growth temperature T1. In other words, the growth temperature of the passivation layer 60 in the constant low temperature session LT is maintained at the first growth temperature T1 in a third predetermined time t3 for growing the passivation layer 60 with a predetermined thickness at the growth temperature the same as the growth temperature of the barrier layer 50. Referring to Table 2, the thickness percentage of the passivation layer 60 in the constant low temperature session LT of the comparative example 1 is 100%, the thickness percentage of the passivation layer 60 in the heating session RT of the comparative example 1 is 0%, and the thickness percentage of the passivation layer 60 in the constant high temperature session HT of the comparative example 1 is 0%.

The Embodiment 1

Figure 7:
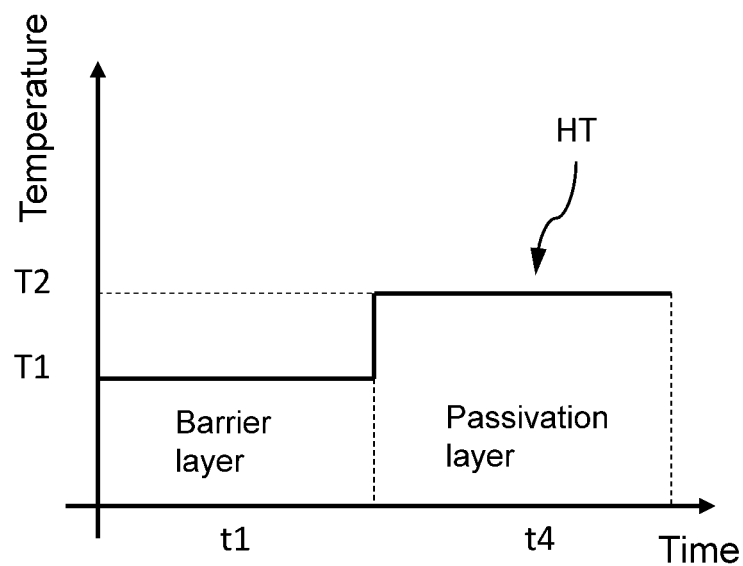
FIG. 7 is a schematic view showing a relationship between the time and the temperature of growing the passivation layer according to an embodiment of the present invention.

Referring to FIG. 7, in the embodiment 1, the growth temperature of growing the passivation layer 60 is the second growth temperature T2. In other words, the growth temperature of the passivation layer 60 is rapidly increased from the first growth temperature T1 to the second growth temperature T2 and is maintained at the second growth temperature T2 during the constant high temperature session HT in a fourth predetermined time t4 for growing the passivation layer 60 with the predetermined thickness. Referring to Table 2, the thickness percentage of the passivation layer 60 in the constant low temperature session LT of the embodiment 1 is 0%, the thickness percentage of the passivation layer 60 in the heating session RT of the embodiment 1 is 0%, and the thickness percentage of the passivation layer 60 in the constant high temperature session HT of the embodiment 1 is 100%. As a time taken for the growth temperature of the passivation layer 60 to increase from the first growth temperature T1 to the second growth temperature T2 is very short, the growth thickness of the passivation layer 60 in the heating session RT of the embodiment 1 approaches to zero.

The Embodiments 2 and 3

Figure 3:
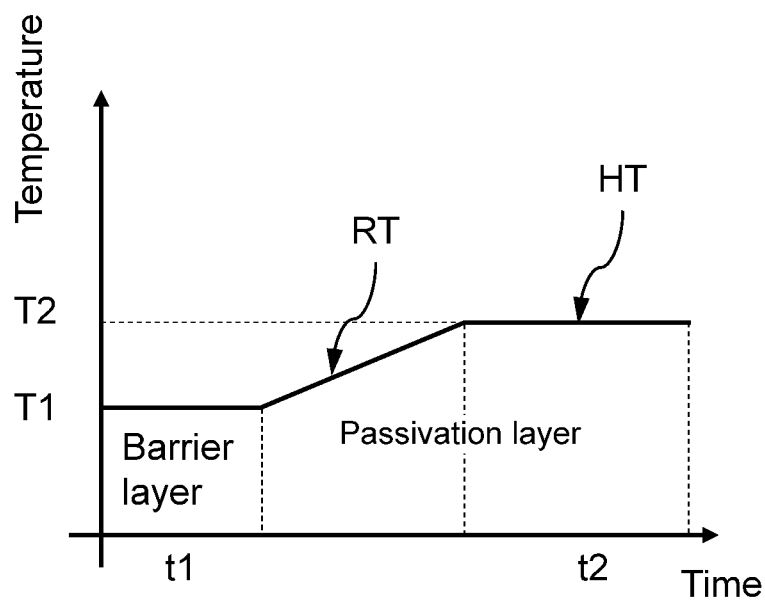
FIG. 3 is a schematic view showing a relationship between the time and the temperature of growing the passivation layer according to the embodiment of the present invention.

Referring to FIG. 3, in the embodiments 2 and 3, the growth temperature of the passivation layer 60 is controlled to increase from the first growth temperature T1 to the second growth temperature T2 in the heating session RT, and then the second growth temperature T2 is maintained during the constant high temperature session HT in a second predetermined time t2. Referring to Table 2, the thickness percentage of the passivation layer 60 in the constant low temperature session LT of the embodiment 2 is 0%, the thickness percentage of the passivation layer 60 in the heating session RT of the embodiment 2 is 25%, and the thickness percentage of the passivation layer 60 in the constant high temperature session HT of the embodiment 2 is 75%. The thickness percentage of the passivation layer 60 in the constant low temperature session LT of the embodiment 3 is 0%, the thickness percentage of the passivation layer 60 in the heating session RT of the embodiment 3 is 5%, and the thickness percentage of the passivation layer 60 in the constant high temperature session HT is 95%.

The Embodiment 4

Referring to FIG. 4, in the embodiment 4, the growth temperature of the passivation layer 60 is firstly controlled to maintain at the first growth temperature T1 during the constant low temperature session LT in a fifth predetermined time ta, then the first growth temperature T1 is increased to the second growth temperature T2 through the heating session RT in a sixth predetermined time tb, and afterward the second growth temperature T2 is maintained during the constant high temperature session HT in a seventh predetermined time tc. Referring to Table 2, the thickness percentage of the passivation layer 60 in the constant low temperature session LT of the embodiment 4 is 25%, the thickness percentage of the passivation layer 60 in the heating session RT of the embodiment 4 is 25%, and the thickness percentage of the passivation layer 60 in the constant high temperature session HT of the embodiment 4 is 50%.

Referring to Table 2, as shown in the embodiments 1 to 4, when the passivation layer 60 satisfies that the growth thickness of the passivation layer 60 in the constant low temperature session LT is between 0% and 25% of the total thickness of the passivation layer and the growth thickness of the passivation layer 60 in the heating session RT is between 0% and 25% of the total thickness of the passivation layer 60, a thin film refractive index of the embodiments 1 to 4 is between 2.074 and 2.11; compared with a thin film refractive index of 2.014 of the comparative example 1, a structure of each of the embodiments 1 to 4 has a better refractive index performance.

Additionally, as shown in the embodiments 2 and 3, when the passivation layer 60 satisfies that the growth thickness of the passivation layer 60 in the constant low temperature session LT is 0% of the total thickness of the passivation layer 60, the growth thickness of the passivation layer 60 in the heating session RT is between 5% and 25% of the total thickness of the passivation layer 60, and the growth thickness of the passivation layer 60 in the constant high temperature session HT is between 75% and 95% of the total thickness of the passivation layer 60, a breakdown voltage of the embodiment 2 is 1.05 V/nm and a breakdown voltage of the embodiment 3 is 1.1 V/nm, and both a root-mean-square (RMS) roughness of the embodiment 2 and a RMS roughness of the embodiment 3 are less than 0.5 nm, while a breakdown voltage of the comparative example 1 is 0.96 V/nm and an RMS roughness of the comparative example 1 is greater than 0.5 nm. In other words, both the structure of the embodiment 2 and the structure of the embodiment 3 have a better ability of withstanding voltage and a better RMS roughness performance than the comparative example 1.

Moreover, as shown in the embodiments 2 to 4, when the passivation layer 60 satisfies that the growth thickness of the passivation layer 60 in the heating session RT is between 5% and 25% of the total thickness of the passivation layer 60 and the growth thickness of the passivation layer 60 in the constant high temperature session HT is between 50% and 95% of the total thickness of the passivation layer 60, a percentage change of a sheet resistance value of each of the embodiments 2 to 4 is less than or equal to 0.1%, while a percentage change of a resistance value of the comparative example 1 is larger than 0.5%; in other words, the structure of each of the embodiments 2 to 4 has a better sheet resistance value stability than the comparative example 1; additionally, as shown in the results of the embodiments 2 to 4, the first growth temperature T1 is controlled to increase to the second growth temperature T2 through the heating session RT in a period of time (the embodiments 2 to 4) during the growth process of the passivation layer 60, so that a structure with a better sheet resistance value stability could be obtained when compared with growing the passivation layer 60 completely in the constant low temperature session LT (the comparative example 1) or growing the passivation layer 60 completely in the constant high temperature session HT (the embodiment 1).

TABLE 2

|  | Comparative example 1 | Embodiment 1 | Embodiment 2 | Embodiment 3 | Embodiment 4 |
| --- | --- | --- | --- | --- | --- |
| Thickness percentage of the passivation layer in the constant high temperature session HT (%) | 0 | 100 | 75 | 95 | 50 |
| Thickness percentage of the passivation layer in the heating session RT (%) | 0 | 0 | 25 | 5 | 25 |
| Thickness percentage of the passivation layer in the constant low temperature session LT (%) | 100 | 0 | 0 | 0 | 25 |
| Refractive index | 2.014 | 2.1 | 2.078 | 2.074 | 2.11 |

TABLE 2-continued

|  | Comparative example 1 | Embodiment 1 | Embodiment 2 | Embodiment 3 | Embodiment 4 |
|---|---|---|---|---|---|
| Breakdown voltage (V/nm) | 0.96 | 1.04 | 1.05 | 1.1 | 0.95 |
| Percentage change of the sheet resistance value (%) | >0.5 | 0.5-0.2 | ≤0.1 | ≤0.1 | ≤0.1 |
| RMS roughness (nm) | >0.5 | >0.5 | <0.5 | <0.5 | >0.5 |

Figure 2:
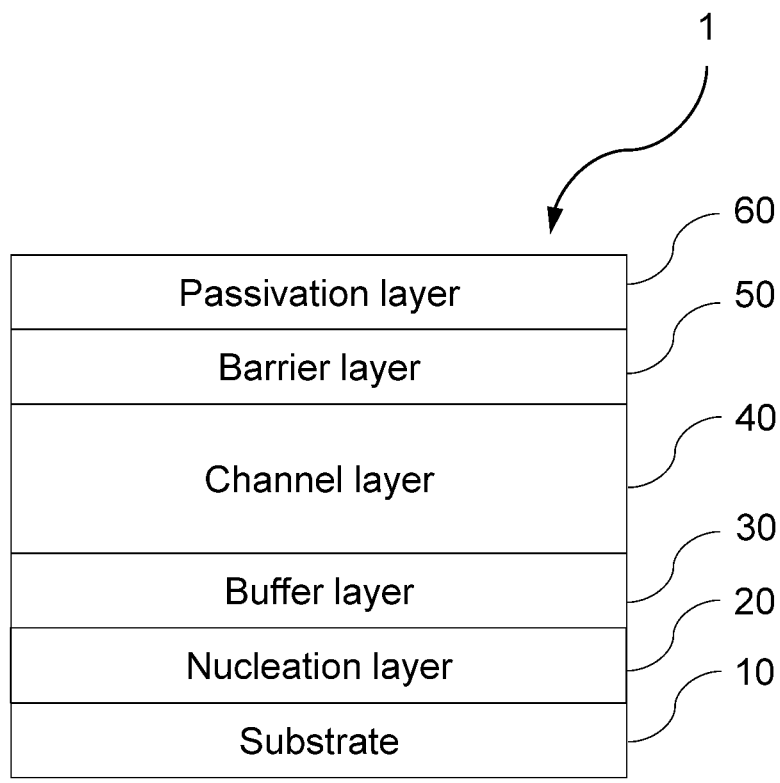
FIG. 2 is a schematic view of the HEMT structure according to an embodiment of the present invention.

As shown in FIG. 2, the present invention further provides the HEMT structure 1, including a substrate 10, a nucleation layer 20, a buffer layer 30, a channel layer 40, a barrier layer 50, and a passivation layer 60 in order, wherein a two-dimensional electron gas (2-DEG) region is formed in the channel layer 40 along an interface between the channel layer 40 and the barrier layer 50. A change of a sheet resistance value of the 2-DEG region of the channel layer 40 in a period of time is less than or equal to 1%, wherein the period of time is greater than or equal to three months. By forming the passivation layer 60, the change of the sheet resistance value of the 2-DEG region of the channel layer 40 in the period of time is less than or equal to 1%, wherein the period of time is greater than or equal to three months, thereby achieving the objective of increasing a stability of the HEMT. In the current embodiment, the HEMT structure 1 is manufactured through the aforementioned method of manufacturing the HEMT structure.

In the current embodiment, the passivation layer 60 includes silicon nitride. A total thickness of the passivation layer 60 is less than or equal to 100 nm, a refractive index of the passivation layer 60 is between 2.05 and 2.28, a root-mean-square (RMS) roughness of the passivation layer 60 is less than or equal to 0.5 nm, and a breakdown voltage withstanding per unit thickness of the passivation layer 60 is between 1 V/nm and 1.15V/nm. In other words, the HEMT structure 1 provided in the present invention has a better thin film density, a better surface roughness performance, a better ability of withstanding voltage, and a better sheet resistance value stability, thereby achieving the objective of increasing the stability of the HEMT.

With the aforementioned design, by controlling the passivation layer 60 and the barrier layer 50 to uninterruptedly grow in the same growth chamber, defects of the passivation layer 60 generated in the growth process due to the drastic change in temperature, pressure, or atmosphere or degrading the quality of the interface between the passivation layer 60 and the barrier layer 50 could be avoided, thereby providing the passivation layer 60 with a good quality and the interface between the passivation layer 60 and the barrier layer 50 with a good quality, so that the objective of increasing the performance of the HEMT could be achieved. Additionally, the present invention further provides the HEMT structure 1. By forming the passivation layer 60, the change of the sheet resistance value of the two-dimensional electron gas (2-DEG) region of the channel layer 40 in the period of time is less than or equal to 1%, wherein the period of time is greater than or equal to three months, thereby achieving the objective of increasing the stability of the HEMT.

It must be pointed out that the embodiments described above are only some preferred embodiments of the present invention. All equivalent structures and methods which employ the concepts disclosed in this specification and the appended claims should fall within the scope of the present invention.

What is claimed is:

1. A method of manufacturing a high electron mobility transistor (HEMT) structure, comprising steps of:
    A: providing a substrate;
    B: forming a nucleation layer on the substrate;
    C: forming a buffer layer on the nucleation layer;
    D: forming a channel layer on the buffer layer;
    E: depositing a barrier layer on the channel layer; wherein a growth temperature of the barrier layer is a first growth temperature; a two-dimensional electron gas (2-DEG) region is formed in the channel layer along an interface between the channel layer and the barrier layer; step E is performed in a growth chamber; and
    F: uninterruptedly depositing a passivation layer on the barrier layer in the growth chamber after performing step E, wherein a growth temperature of the passivation layer is controlled to increase from the first growth temperature to a second growth temperature through a heating session.

2. The method as claimed in claim 1, wherein the barrier layer and the passivation layer are formed in an identical growth condition of pressure and atmosphere.

3. The method as claimed in claim 1, wherein step F comprises controlling the growth temperature of the passivation layer to maintain at the second growth temperature in a constant high temperature session.

4. The method as claimed in claim 3, wherein a growth thickness of the passivation layer in the constant high temperature session is greater than or equal to 50% of a total thickness of the passivation layer.

5. The method as claimed in claim 4, wherein step F comprises controlling the growth temperature of the passivation layer to firstly maintain at the first growth temperature in a constant low temperature session, and then to maintain at the second growth temperature in the constant high temperature session after heating in the heating session; the total thickness of the passivation layer is a sum of a growth thickness of the passivation layer in the constant low temperature session, a growth thickness of the passivation layer in the heating session, and the growth thickness of the passivation layer in the constant high temperature session; the growth thickness of the passivation layer in the constant low temperature session is between 0% and 25% of the total thickness of the passivation layer, and the growth thickness of the passivation layer in the heating session is between 0% and 25% of the total thickness of the passivation layer.

6. The method as claimed in claim 1, wherein the second growth temperature is greater than or equal to 1000° C.

7. The method as claimed in claim 1, wherein a heating rate of the heating session is between 10° C./min and 30° C./min.

8. The method as claimed in claim 1, wherein the heating session comprises at least one heating step; the at least one heating step comprises one to fifteen heating steps; a temperature is controlled to increase between 30° C. and 60° C.

in each of the at least one heating step, and a heating rate in each of the at least one heating step is controlled to be less than or equal to 60° C./min.

9. The method as claimed in claim 1, wherein the passivation layer comprises silicon nitride.

10. The method as claimed in claim 1, wherein a total thickness of the passivation layer is less than or equal to 100 nm.

11. The method as claimed in claim 1, wherein a refractive index of the passivation layer is between 2.05 and 2.28.

12. The method as claimed in claim 1, wherein a root-mean-square (RMS) roughness of the passivation layer is less than or equal to 0.5 nm.

13. The method as claimed in claim 1, wherein a breakdown voltage withstanding per unit thickness of the passivation layer is between 1 V/nm and 1.15 V/nm.

14. The method as claimed in claim 1, further comprising measuring a sheet resistance value of the 2-DEG region of the channel layer to obtain a first sheet resistance value and measuring the sheet resistance value of the 2-DEG region of the channel layer after a period of time to obtain a second sheet resistance value, wherein the period of time is greater than or equal to three months; an absolute value of a percentage change of the sheet resistance value is less than or equal to 0.1%; the percentage change of the sheet resistance value is defined as (the second sheet resistance value−the first sheet resistance value)/the first sheet resistance value*100%.

15. A high electron mobility transistor (HEMT) structure, comprising in order:
   a substrate;
   a nucleation layer;
   a buffer layer;
   a channel layer;
   a barrier layer, wherein a two-dimensional electron gas (2-DEG) region is formed in the channel layer along an interface between the channel layer and the barrier layer; and
   a passivation layer;
   wherein a change of a sheet resistance value of the 2-DEG region of the channel layer in a period of time is less than or equal to 1%; the period of time is greater than or equal to three months.

16. The HEMT structure as claimed in claim 15, wherein a total thickness of the passivation layer is less than or equal to 100 nm.

17. The HEMT structure as claimed in claim 15, wherein a refractive index of the passivation layer is between 2.05 and 2.28.

18. The HEMT structure as claimed in claim 15, wherein a root-mean-square (RMS) roughness of the passivation layer is less than or equal to 0.5 nm.

19. The HEMT structure as claimed in claim 15, wherein a breakdown voltage withstanding per unit thickness of the passivation layer is between 1 V/nm and 1.15 V/nm.

20. The HEMT structure as claimed in claim 15, wherein the passivation layer comprises silicon nitride.

* * * * *